United States Patent
Kimura

(10) Patent No.: US 6,496,525 B1
(45) Date of Patent: Dec. 17, 2002

(54) LASER DRIVER AND OPTICAL TRANSCEIVER

(75) Inventor: Hiroshi Kimura, Hyogo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/400,190

(22) Filed: Sep. 21, 1999

(30) Foreign Application Priority Data

Sep. 21, 1998 (JP) .......................................... 10-266205

(51) Int. Cl.[7] .............................. H01S 3/13; H01S 3/00
(52) U.S. Cl. ............................... 372/38.02; 372/38.01; 372/38.07; 372/29.01; 372/29.015
(58) Field of Search ......................... 372/38.02, 38.07, 372/38.01, 29.01, 29.011, 29.015; 250/205

(56) References Cited

U.S. PATENT DOCUMENTS

| | | | | |
|---|---|---|---|---|
| 4,757,508 A | * | 7/1988 | Zimmerman | 372/26 |
| 4,837,428 A | * | 6/1989 | Takagi et al. | 250/205 |
| 5,986,687 A | * | 11/1999 | Hori | 347/246 |
| 6,055,252 A | * | 4/2000 | Zhang | 372/34 |

FOREIGN PATENT DOCUMENTS

| | | | |
|---|---|---|---|
| JP | 4306962 | * | 10/1992 |
| JP | 05063273 | | 12/1993 |

* cited by examiner

*Primary Examiner*—Paul Ip
*Assistant Examiner*—Armando Rodriguez
(74) *Attorney, Agent, or Firm*—McDermott, Will & Emery

(57) ABSTRACT

A laser driver according to the present invention is adapted to keep the optical output power of a laser diode constant even if the temperature has changed or if the performance of the laser diode has deteriorated with time. The laser driver includes a photodiode, a current-to-voltage converter, a reference voltage generator, a transconductor, a holding capacitor and a drive current output circuit. The current-to-voltage converter converts an output current of the photodiode, which is provided to monitor the optical output of the laser diode, into a monitor voltage. The transconductor supplies an output current corresponding to a difference between the monitor voltage and a predetermined reference voltage. The drive current output circuit outputs a laser drive current corresponding to the voltage held by the holding capacitor, which is connected to the output terminal of the transconductor. The laser driver with this configuration performs a feedback control in such a manner as to equalize the monitor voltage with the reference voltage, thereby keeping the optical output power of the laser diode constant. As a result, high-precision and stabilized APC performance is realized.

14 Claims, 13 Drawing Sheets

LASER DRIVER AND OPTICAL TRANSCEIVER

BACKGROUND OF THE INVENTION

The present invention generally relates to a laser driver for an optical signal transmitter in an optical communication system like a passive optical network (PON) system. More particularly, the present invention relates to a laser driver with an automatic power control (APC) function of maintaining constant optical output power responsive to a burst signal and irrespective of a variation in temperature.

In recent years, the optical subscriber systems are under vigorous research and development to set up a fiber-to-the-home (FTTH) communication network in the near future. However, it is economically difficult to introduce optical fibers into general home users. This is because an optical fiber has a gigantic transmission capacity, but is much more expensive than a conventional metallic communication line. Under the circumstances such as these, the PON system is expected to contribute much to the realization of the FTTH network considering the cost effectiveness thereof. The PON system can be less expensive, because a signal optical fiber extended from a base station is branched to provide bidirectional communication service for a great number of subscribers.

It is known that a semiconductor laser diode, which is ordinarily used for transmitting an optical signal in such an optical communication system, is highly temperature-dependent owing to the characteristics thereof. Specifically, if the laser diode is driven with a constant current supplied, the optical output power thereof decreases considerably with the rise in temperature. In addition, the performance of the laser diode deteriorates with time, and the optical output power also declines after years of operation. Accordingly, in general, a laser driver is constructed in such a manner as to maintain constant optical output power by monitoring the optical output power of the laser diode using a photodiode (PD) and feeding the information back to a laser driving section.

An exemplary laser driver with such a construction is disclosed in Japanese Laid-Open Publication No. 5-63273, for example. In this prior art laser driver, the optical output power of a laser diode is received by a monitoring photodiode. The output current of the monitoring photodiode is converted into a voltage. A difference between this voltage and a reference voltage is amplified by a differential amplifier. And then a current-supplying transistor is driven with the output of the differential amplifier.

According to the conventional construction, however, if the amplification factor of the amplifier for amplifying the difference between the output voltage of the monitoring photodiode and the reference voltage has varied due to a change in temperature, for example, the output current driving the laser diode also changes. Thus, it is difficult to attain high-precision APC performance in such a situation.

SUMMARY OF THE INVENTION

An object of the present invention is providing a laser driver realizing high-precision APC performance irrespective of the variation in characteristics of the components thereof.

Specifically, a laser driver for driving a laser diode according to the present invention includes a current-to-voltage converter, a reference voltage generator, a transconductor, a holding capacitor and a drive current output circuit. The current-to-voltage converter converts an output current of a photodiode, which is provided to monitor the optical output of the laser diode, into a voltage and then outputs the voltage as a monitor voltage. The reference voltage generator generates a predetermined reference voltage. The transconductor receives the monitor and reference voltages and supplies an output current corresponding to a difference between these input voltages. The holding capacitor is connected to an output terminal of the transconductor. And the drive current output circuit receives a voltage held by the holding capacitor as an input voltage and outputs a laser drive current corresponding to the input voltage. The laser driver is constructed to perform a feedback control in such a manner as to equalize the monitor voltage with the reference voltage.

According to the present invention, a feedback control is performed in such a manner to equalize the monitor voltage with the predetermined reference voltage. Thus, even if the current-to-optical-output conversion efficiency of the laser diode has changed due to variation in temperature or deterioration with time, the optical output power of the laser diode is kept constant. As a result, high-precision and stabilized APC performance is realized.

In one embodiment of the present invention, the current-to-voltage converter may include: an inverting amplifier receiving the output current of the photodiode; and a feedback resistor connected between input and output terminals of the inverting amplifier. In such an embodiment, the current-to-voltage converter is implementable to have a simple configuration.

In an alternate embodiment, the current-to-voltage converter may include: a transistor, the source and drain of which are connected to the input and output of the current-to-voltage converter, respectively, a constant voltage being applied to the gate of the transistor; a constant-current power supply connected to the source of the transistor; and a resistor connected to the drain of the transistor. In such an embodiment, the current-to-voltage converter can perform the current-to-voltage conversion stably with reduced power dissipation.

In another alternate embodiment, the predetermined reference voltage generated by the reference voltage generator is preferably controllable responsive to an external input. In such an embodiment, the optical output power of the laser diode is easily adjustable by controlling the reference voltage generated by the reference voltage generator.

In still another embodiment, the transconductor may include: a differential input stage for receiving two input voltages; a first current mirror circuit, the input of the first current mirror circuit being connected to one of two outputs of the differential input stage; a second current mirror circuit with two outputs, the input of the second current mirror circuit being connected to the other output of the differential input stage; a third current mirror circuit with two outputs, the input of the third current mirror circuit being connected to the output of the first current mirror circuit, the two outputs of the third current mirror circuit being connected to the two outputs of the second current mirror circuit, respectively; a fourth current mirror circuit including transistors of one conductivity type, the input of the fourth current mirror circuit being connected to one of the two outputs of the third current mirror circuit; and a fifth current mirror circuit including transistors of the other conductivity type, the input of the fifth current mirror circuit being connected to the other output of the third current mirror circuit. The outputs of the fourth and fifth current mirror circuits are connected to each other at a node, from which the current is output. In such an embodiment, an output current corresponding to a difference between the two input voltages can be obtained easily.

In still another embodiment of the present invention, the laser driver may further include a control signal generator for controlling the operations of the drive current output circuit and the transconductor responsive to a data signal. The control signal generator preferably activates the transconductor after a prescribed time has passed since the drive current output circuit was made to start to output the laser drive current by the control signal generator. In such an embodiment, it is possible to eliminate an error, which is caused by a delay between the output of the laser drive current and the conversion of the output current of the photodiode into the monitor voltage.

In still another embodiment, the laser driver may further include an adaptive bias circuit for charging or discharging the holding capacitor in such a manner as to reduce a difference between the monitor and reference voltages if the difference is larger than a predetermined value. In such an embodiment, high-speed APC response is realized.

In this particular embodiment of the present invention, the laser driver may further include a control signal generator for controlling the operations of the drive current output circuit and the adaptive bias circuit responsive to a data signal. The control signal generator preferably activates the adaptive bias circuit if the difference between the monitor and reference voltages is larger than the predetermined value after a prescribed time has passed since the drive current output circuit was made to start to output the laser drive current by the control signal generator. In such an embodiment, it is possible to eliminate an error, which is caused by a delay between the output of the laser drive current and the conversion of the output current of the photodiode into the monitor voltage.

In yet another embodiment, the laser driver may further include a transconductance controller for controlling a transconductance of the transconductor based on the predetermined reference voltage. In such an embodiment, the fluctuation in APC response time, which results from the assembling-induced variation, can be suppressed.

In this particular embodiment, the transconductance controller may control the transconductance by changing a bias current of a differential input stage included in the transconductor. In such an embodiment, the transconductance of the transconductor can be controlled easily.

In an alternate embodiment, the transconductor may include first and second differential input stages with mutually different transconductances. And the transconductance controller may control the transconductance by changing a bias current ratio of the first and second differential input stages. In such an embodiment, the transconductance can be controlled in a broader range.

In still another embodiment, a voltage held by a holding capacitor is preferably limited such that the laser drive current does not exceed a predetermined upper limit. In such an embodiment, it is possible to prevent the laser diode from being broken down due to an excessively large drive current.

In still another embodiment, the laser driver may further include an alarm circuit for outputting an alarm signal if a voltage held by the holding capacitor exceeds a predetermined upper limit and if the monitor voltage is smaller than a predetermined lower limit. In such an embodiment, a fault of the laser diode, if any, can be spotted easily.

An optical transceiver according to the present invention is adapted to establish an optical communication. The optical transceiver includes: a transmitter section for converting data to be transmitted into laser light by driving a laser diode and then transmitting the laser light; and a receiver section for converting the laser light received into received data. The transmitter section includes the laser driver of the present invention and drives the laser diode using the laser driver.

DESCRIPTION OF THE PREFERRED EMBODIMENTS

Hereinafter, preferred embodiments of the present invention will be described with reference to the accompanying drawings.

EMBODIMENT 1

Figure 1:
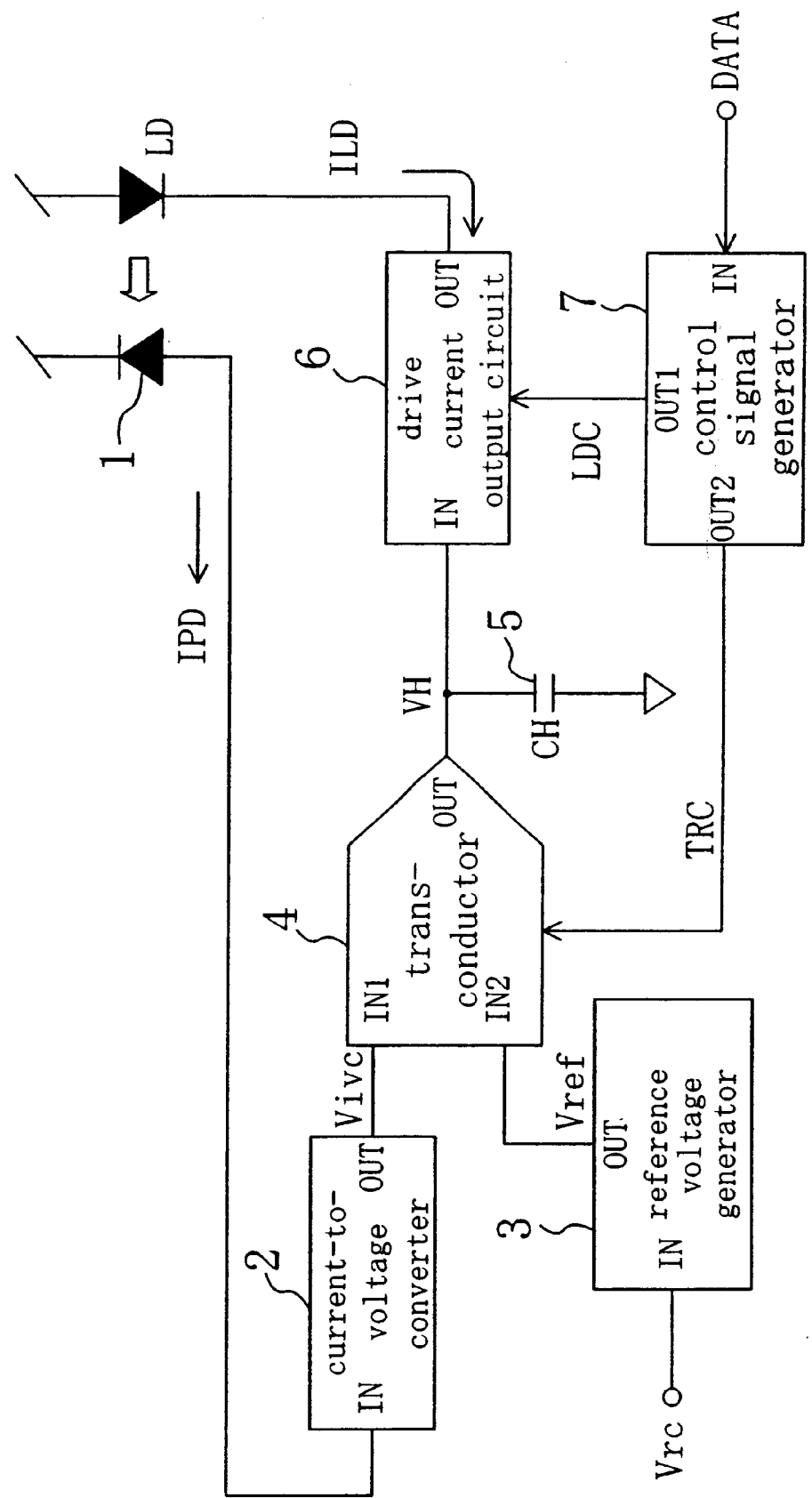
FIG. 1 is a block diagram illustrating a configuration for a laser driver according to a first embodiment of the present invention.

FIG. 1 illustrates an exemplary configuration for a laser driver according to a first embodiment of the present invention. As shown in FIG. 1, the laser driver includes a photodiode (PD) 1, a current-to-voltage converter 2 and a reference voltage generator 3. The photodiode 1 monitors the optical output power of a laser diode LD. The current-to-voltage converter 2 converts the output current IPD of the photodiode 1 into a voltage and outputs the voltage as a monitor voltage Vivc. And the reference voltage generator 3 generates a predetermined reference voltage Vref.

The laser driver also includes a transconductor 4 for outputting a current Iout corresponding to a difference between the voltages Vin1 and Vin2 at the two input terminals IN1 and IN2 thereof. The laser driver further includes a holding capacitor 5 (with a capacitance CH) connected to the output terminal of the transconductor 4. The output current Iout of the transconductor 4 is given by the following Equation (1):

$$Iout=Gm(Vin2-Vin1) \qquad (1)$$

where Gm is a transconductance of the transconductor 4. Specifically, if Vin2>Vin1, the Iout>0 and a current is supplied to the holding capacitor 5. As a result, a voltage VH held by the capacitor 5 rises. On the other hand, if Vin2<Vin1, then Iout<0 and a current is extracted from the holding capacitor 5. As a result, the voltage VH held by the capacitor 5 falls.

The laser driver further includes a drive current output circuit 6 and a control signal generator 7. The drive current output circuit 6 outputs a laser drive current corresponding to the voltage VH held by the capacitor 5. The control signal generator 7 generates signals TRC and LDC for controlling the transconductor 4 and the drive current output circuit 6, respectively, responsive to a data signal DATA.

In the illustrated embodiment, the monitor voltage Vivc output from the current-to-voltage converter 2 is supposed to increase proportionally to the output current IPD of the photodiode 1. Also, the laser drive current ILD output from the drive current output circuit 6 is supposed to increase proportionally to the voltage VH held by the holding capacitor 5.

Hereinafter, the operation of the laser driver shown in FIG. 1 will be described.

Responsive to the data signal DATA, the control signal generator 7 outputs the control signal LDC to the drive current output circuit 6. When the drive current output circuit 6 starts to supply the laser drive current ILD in response to the control signal LDC, the laser diode LD begins to emit laser radiation and the optical output power of the laser diode LD is input to the monitoring photodiode 1. The photodiode 1 outputs the current IPD proportionally to the optical output power of the laser diode LD. The output current IPD is converted by the current-to-voltage converter 2 into the monitor voltage Vivc, which is applied to one input terminal IN1 of the transconductor 4. The reference voltage Vref, which has been output from the reference voltage generator 3, is applied to the other input terminal IN2 of the transconductor 4.

Suppose the monitor voltage Vivc is lower than the reference voltage Vref. In such a situation, the current Iout given by the following Equation $$Iout=Gm(Vref-Vivc)>0$$

is supplied from the transconductor 4 into the holding capacitor 5. As a result, the voltage VH held by the capacitor 5 rises. As the voltage VH rises, the drive current output circuit 6 increases the laser drive current ILD, thereby raising the optical output power of the laser diode LD. Then, the output current IPD of the photodiode 1 increases with the rise in the optical output power of the laser diode LD. Consequently, the monitor voltage Vivc goes on rising and getting closer to the reference voltage Vref.

And once the monitor voltage Vivc has exceeded the reference voltage Vref, the transconductance 4 starts to extract a current Iout given by the following Equation $$Iout=|Gm(Vref-Vivc)|$$

from the holding capacitor 5. As a result, the voltage VH held by the holding capacitor 5 falls. As the voltage VH falls, the drive current output circuit 6 decreases the laser drive current ILD, thereby lowering the optical output power of the laser diode LD. Then, the output current IPD of the photodiode 1 decreases with the fall in the optical output power of the laser diode LD. Consequently, the monitor voltage Vivc goes on falling and getting closer to the reference voltage Vref.

As a result of such an operation, the optical output power of the laser diode LD is ultimately stabilized at a point in time the monitor voltage Vivc is equalized with the reference voltage Vref. Accordingly, even if the current-to-optical-output conversion efficiency of the laser diode LD has changed due to a variation in temperature, for example, the laser driver can control the laser drive current ILD such that Vivc=Vref is always met. In this manner, the optical output power of the laser diode LD is kept constant.

The prime feature of the present invention consists in that the optical output power of the laser diode LD is kept constant as long as the output voltage Vref of the reference voltage generator 3 is constant. This is because the output current Iout of the transconductor 4 becomes zero in an equilibrium state established by a feedback control irrespective of the voltage-to-current conversion efficiency of the drive current output circuit 6 or the transconductance of the transconductor 4. Therefore, high-precision and stabilized automatic power control is realized.

Figure 2:
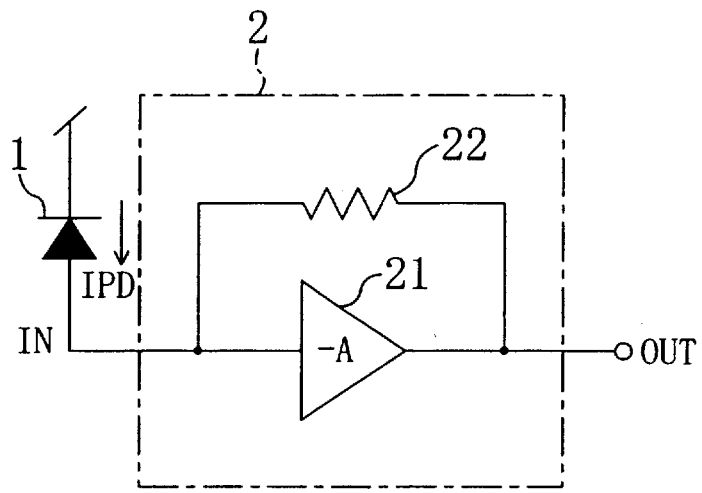
FIG. 2 illustrates an exemplary internal configuration for the current-to-voltage converter 2 of the laser driver shown in FIG. 1.

FIG. 2 illustrates an exemplary internal configuration for the current-to-voltage converter 2, which includes a transimpedance amplifier. As shown in FIG. 2, the current-to-voltage converter 2 includes: an inverting amplifier 21 receiving the output current IPD of the photodiode 1 as an input; and a feedback resistor 22 connected between the input and output terminals of the inverting amplifier 21. Since such a transimpedance amplifier is constructed to perform a feedback control, the amplifier might possibly oscillate and the power dissipation thereof is disadvantageously high.

Figure 3:
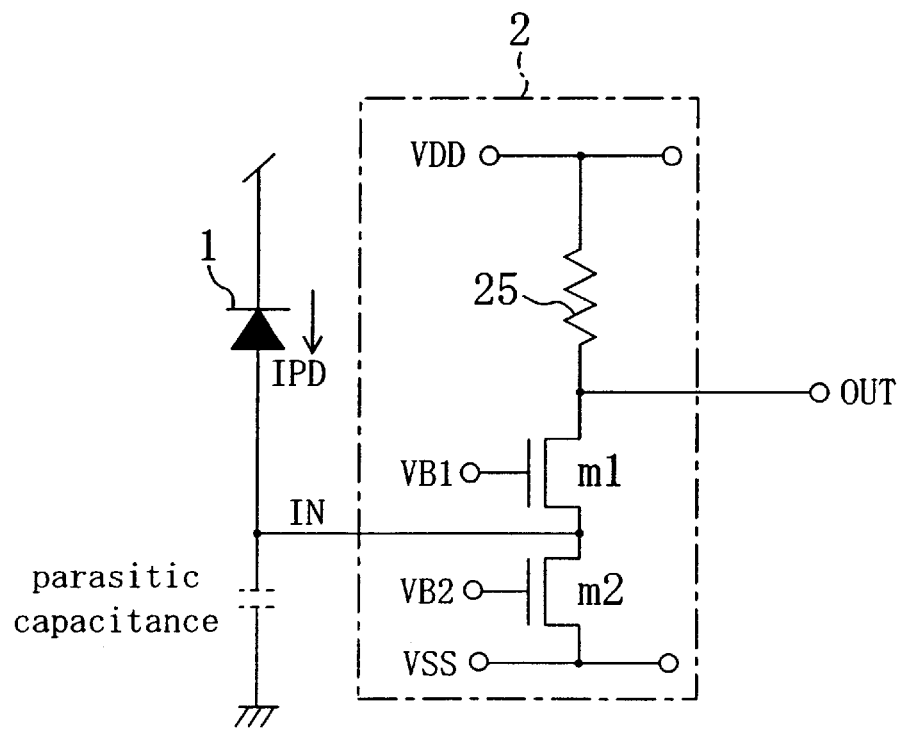
FIG. 3 illustrates another exemplary internal configuration for the current-to-voltage converter 2 of the laser driver shown in FIG. 1.

FIG. 3 illustrates another exemplary internal configuration for the current-to-voltage converter 2, which includes a folded cascode input stage. Specifically, the current-to-voltage converter 2 includes: a cascode transistor m1; a transistor m2 functioning as a constant-current power supply; and a resistor 25. The source and drain of the transistor m1 are connected to the input and output terminals IN and OUT of the current-to-voltage converter 2, and a constant bias voltage VB1 is applied to the gate of the transistor m1. Another constant bias voltage VB2 is applied to the gate of the transistor m2 and the drain of the transistor m2 is connected to the source of the transistor m1. One terminal of the resistor 25 is connected to the drain of the transistor m1. The output current IPD of the photodiode 1 is supplied to the source of the cascode transistor m1.

The current-to-voltage converter 2 shown in FIG. 3 has a very simple configuration, consumes lower power, is less likely to oscillate unlike the transimpedance amplifier, and is hardly affected by a parasitic capacitance at the input terminal because the input impedance thereof is very low.

In the laser driver shown in FIG. 1, the reference voltage generator 3 includes an input terminal IN. And the reference voltage Vref is controllable based on a voltage Vrc applied to the input terminal IN. In such a case, the optical output power of the laser diode LD is easily controllable by regulating the externally input voltage Vrc.

Figure 4:
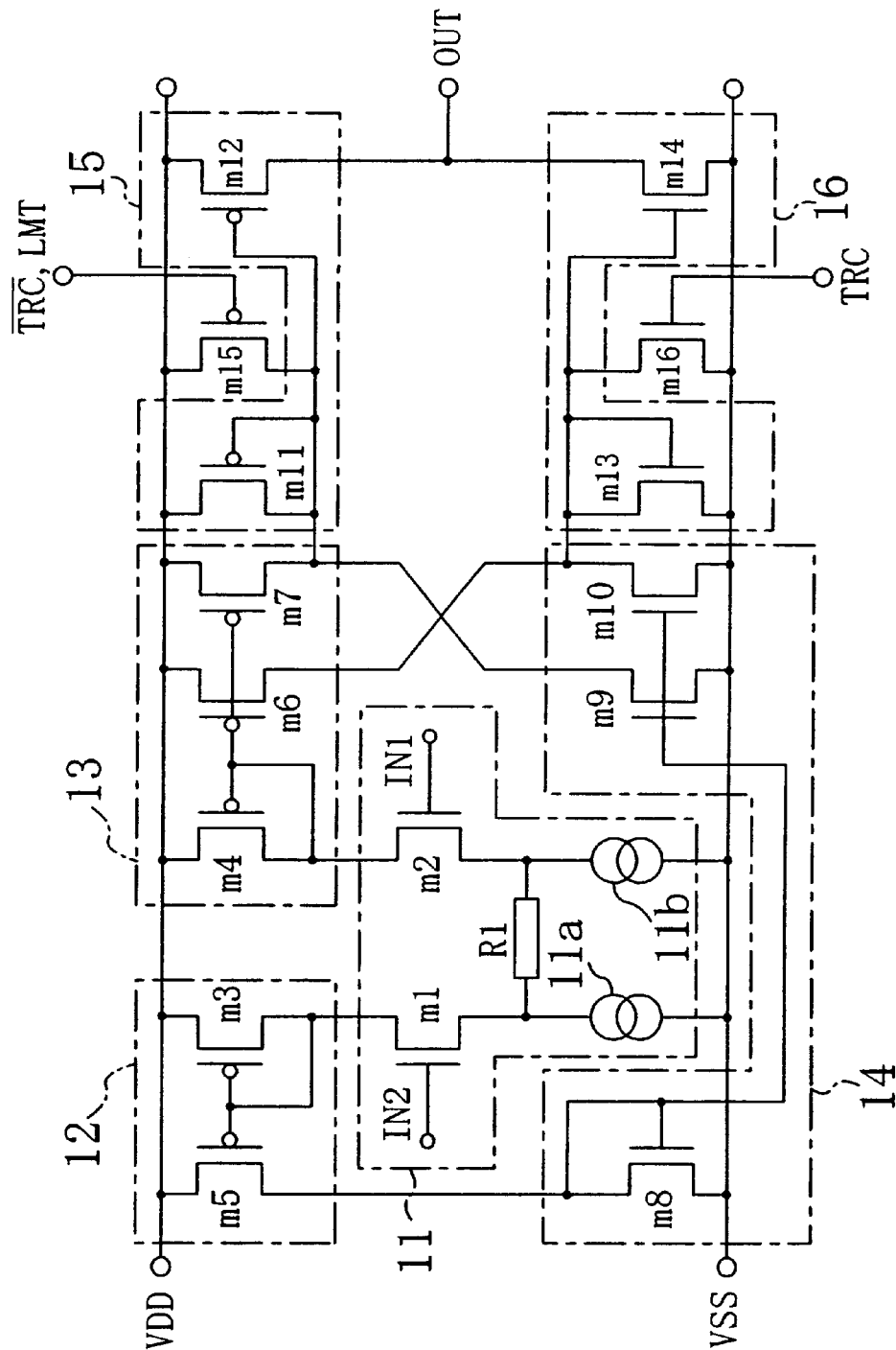
FIG. 4 illustrates an exemplary internal configuration for the transconductor 4 of the laser driver shown in FIG. 1.

FIG. 4 illustrates an exemplary internal configuration for the transconductor 4. As shown in FIG. 4, the transconductor 4 includes a differential input stage 11 receiving two inputs IN1 and IN2 as differential inputs. The differential input stage 11 includes: NMOS transistors m1 and m2 receiving the two inputs IN1 and IN2 at the respective gates; a resistor R1 connected between the sources of the transistors m1 and m2; and first and second current power supplies 11a and 11b connected to the sources of the transistors m1 and m2, respectively.

A first current mirror circuit 12 includes PMOS transistors m3 and m5, while a second current mirror circuit 13 includes PMOS transistors m4, m6 and m7. The drains of the NMOS transistors m1 and m2, which are the two outputs of the differential input stage 11, are connected to the drains of the PMOS transistors m3 and m4, respectively, which are the inputs of the first and second current mirror circuits 12 and 13, respectively.

A third current mirror circuit 14 includes NMOS transistors m8, m9 and m10. The drain of the PMOS transistor m5, which is the output of the first current mirror circuit 12, is connected to the drain of the NMOS transistor m8, which is the input of the third current mirror circuit 14. The drains of the PMOS transistors m6 and m7, which are the outputs of the second current mirror circuit 13, are respectively connected to the drains of the NMOS transistors m10 and m9, which are the outputs of the third current mirror circuit 14.

A fourth current mirror circuit 15 includes PMOS transistors m11 and m12, and a fifth current mirror circuit 16 includes NMOS transistors m13 and m14. The drain of the PMOS transistor m11, which is the input of the fourth current mirror circuit 15, is connected to the drain of the transistor m7 of the second current mirror circuit 13 and to the drain of the transistor m9 of the third current mirror circuit 14. The drain of the NMOS transistor m13, which is the input of the fifth current mirror circuit 16, is connected to the drain of the transistor m6 of the second current mirror circuit 13 and to the drain of the transistor m10 of the third current mirror circuit 14.

And the drain of the PMOS transistor m12, which is the output of the fourth current mirror circuit 15, is connected at a node to the drain of the NMOS transistor m14, which is the output of the fifth mirror circuit 16. This node is the output terminal OUT of the transconductor 4.

PMOS and NMOS transistors m15 and m16 are further provided as killer transistors for cutting off the output transistors m12 and m14, respectively. Signals /TRC and TRC are applied to the respective gates of the transistors m15 and m16.

The transconductor 4 shown in FIG. 4 is characterized in that the second and third current mirror circuits 13 and 14 each include two output nodes and that the fourth and fifth current mirror circuits 15 and 16, which are composed of PMOS and NMOS transistors, respectively, are provided for these two nodes.

Figure 5A:
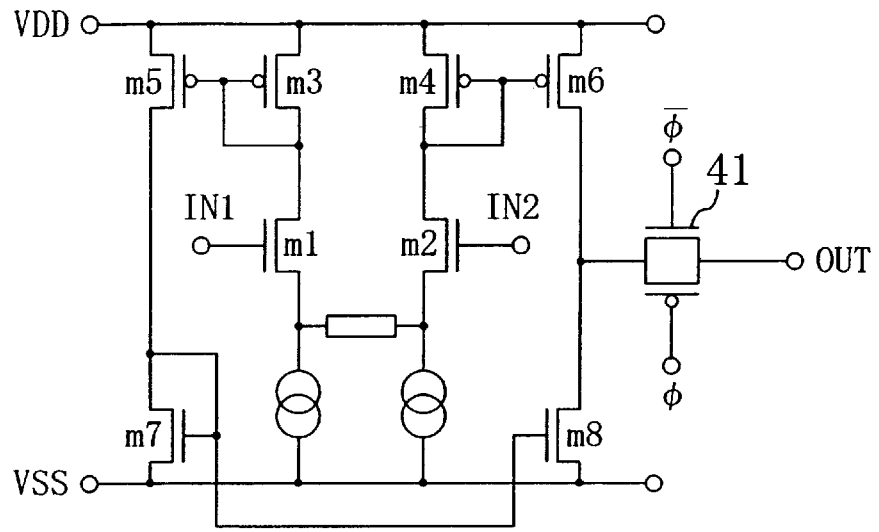
FIGS. 5(a) and 5(b) illustrate other configurations for the transconductor 4 as comparative examples.
Figure 5B:
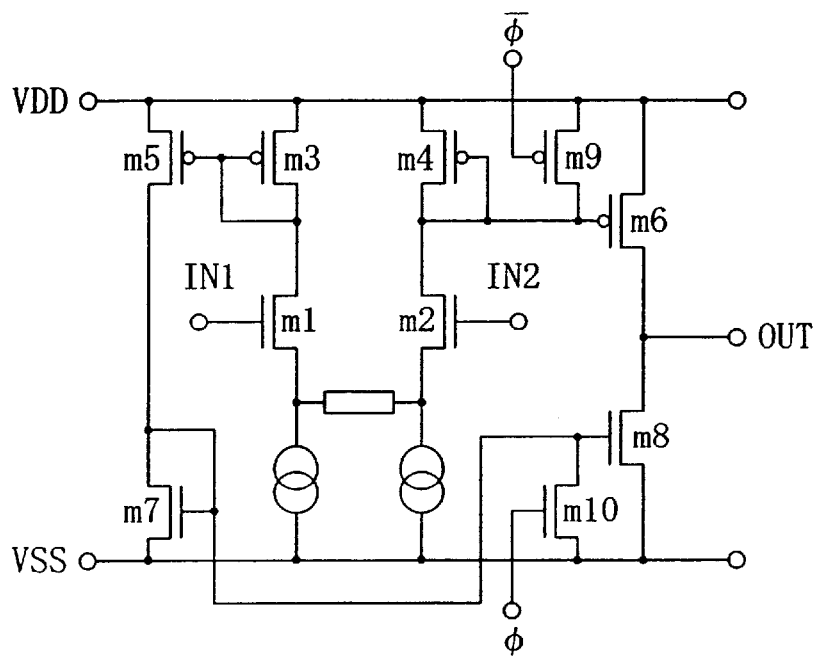

FIGS. 5(a) and 5(b) illustrate other configurations for the transconductor as comparative examples. The transconductor shown in FIG. 5(a) includes an ordinary operational transconductance amplifier (OTA) and a switch 41 for connecting/disconnecting the transconductor to/from the holding capacitor 5. However, the configuration shown in FIG. 5(a) is not practical. The reason is as follows. Specifically, while the switch 41 is OFF, the output of the OTA is stuck at either Low or High level, and therefore, one of the output transistors m6 and m8 never fails to enter a linear operation region. If the switch 41 is turned ON to perform the APC, then an excessively large transient current flows into the holding capacitor 5, thus causing an error in the voltage-to-current conversion.

The transconductor shown in FIG. 5(b) includes killer transistors m9 and m10, which are connected to the gates of the output transistors m6 and m8, respectively, such that the feedback loop can be disconnected by cutting off the output transistors m6 and m8. However, the configuration shown in FIG. 5(b) is not practical, either. This is because it is extremely difficult to completely match the phases of signals $\phi$,/$\phi$ controlling the killer transistors m9 and m10 with each other. Even if these phases have been once matched successfully, the phases will deviate from each other easily because of a variation in temperature or supply voltage. When these phases are not matched completely, excessive charges are supplied into the holding capacitor 5, thus causing a significant error in the voltage-to-current conversion.

IN contrast, the transconductor 4 shown in FIG. 4 can perform high-precision voltage-to-current conversion. Specifically, in the transconductor 4, a difference between the current I6 of the transistor m6 and the current I10 of the transistor m10 is always obtained, and output from the transistor m14 only when I6>I10. In the same way, a difference between the current I7 of the transistor m7 and the current I9 of the transistor m9 is always obtained, too, and output from the transistor m12 only when I9>I7.

That is to say, the transconductor 4 shown in FIG. 4 operates in the following manner. In the illustrated example, the transconductance of the differential input stage 11 is identified by Gm and the input voltages at the two input terminals IN1 and IN2 by Vin1 and Vin2, respectively.

If Vin1<Vin2, then the fifth current mirror circuit 16 is turned OFF. As a result, a current Iout represented by $$Iout = Gm(Vin2 - Vin1)$$

is output from the fourth current mirror circuit 15. Conversely, if Vin1>Vin2, the fourth current mirror circuit 15 is turned OFF. As a result, a current Iout represented by $$Iout = Gm(Vin1 - Vin2)$$

is absorbed by the fifth current mirror circuit 16.

Accordingly, none of the transistor m12 and m14 enters the linear operation region, and excessively large transient current is not output, either. In addition, since the transistors m12 and m14 are not both turned ON simultaneously, no error results from the phase difference between the control signals for the killer transistors m15 and m16. Even if these transistors m12 and m14 are turned ON simultaneously, the output current is substantially zero, because the difference in current between the PMOS and NMOS transistors is always output by the transconductor 4. Thus, no serious problems happen. In this manner, the transconductor 4 shown in FIG. 4 can perform high-precision voltage-to-current conversion.

In the illustrated example, the transconductance Gm is supposed to be constant no matter whether Vin1<Vin2 or Vin1>Vin2 is met. The present invention, however, is not limited thereto, but is also applicable even when mutually different transconductances are set in these two situations. In such a case, the respective current mirror ratios of the fourth and fifth current mirror circuits 15 and 16 may be preset at mutually different values.

Figure 6:
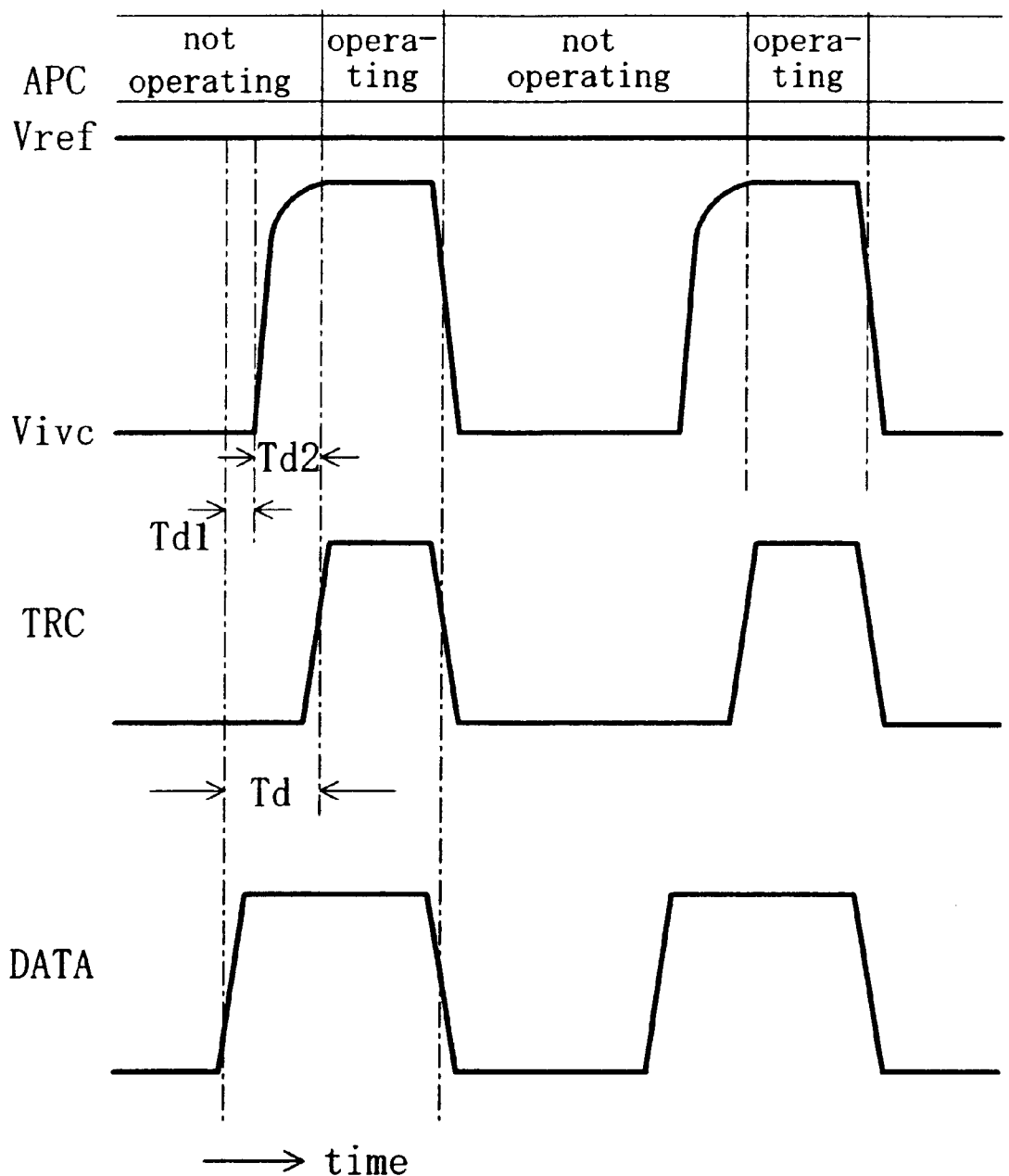
FIG. 6 illustrates how the control signal generator 7 controls the operations of the drive current output circuit 6 and transconductor 4 in the laser driver shown in FIG. 1.

FIG. 6 illustrates how the control signal generator 7 controls the operations of the drive current output circuit 6 and transconductor 4. As shown in FIG. 6, to eliminate an error due to a time delay, the control signal generator 7 does not activate the transconductor 4 until a prescribed time Td has passed since the drive current output circuit 6 was made to start to output the laser drive current ILD.

In synchronism with the assertion of the data signal DATA to the "H" level, the control signal generator 7 outputs the control signal LDC to the drive current output circuit 6, thereby making the output circuit 6 start to output the laser drive current ILD. Then, the laser diode LD emits laser radiation, which is converted by the monitoring photodiode 1 into the current IPD, and the current IPD is supplied to the current-to-voltage converter 2. A time delay Td1 is caused by these operations. Thereafter, another time delay Td2 is produced between a point in time the output current IPD of the photodiode 1 is input to the current-to-voltage converter 2 and a point in time the output voltage Vivc settles.

Before the time Td (=Td1+Td2) has passed since the data signal DATA was asserted to the "H" level, the potential difference (Vref−Vivc) is larger than an ultimate value. Accordingly, if the APC is performed by activating the transconductor 4 during this interval, then the optical output power of the laser diode LD might possibly be converged at a value exceeding a predetermined one. Thus, the control signal generator 7 according to this embodiment generates and outputs the control signal TRC so as to activate the transconductor 4 after the prescribed time Td has passed since the drive current output circuit 6 was made to start to output the laser drive current ILD.

EMBODIMENT 2

Figure 7:
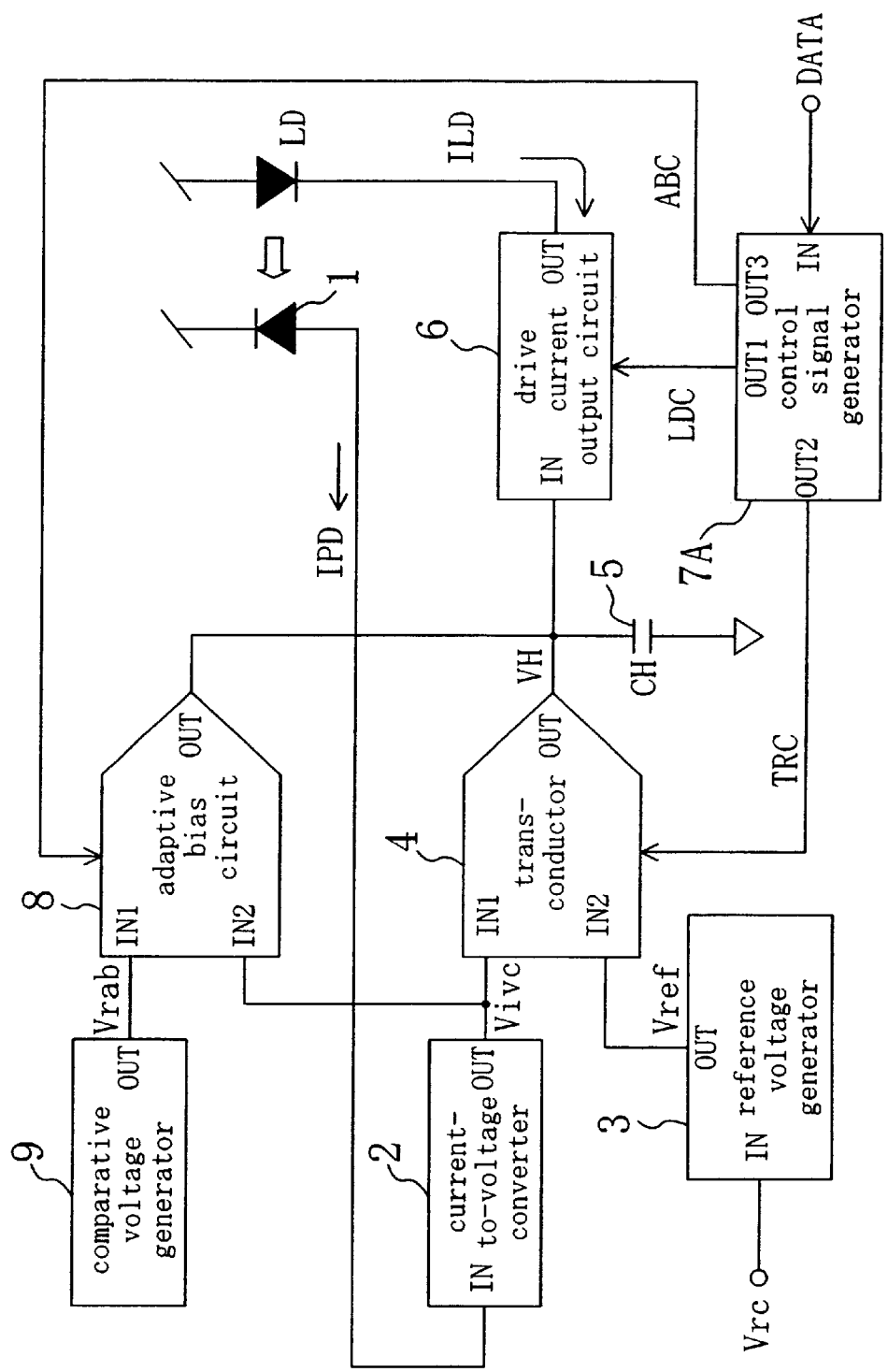
FIG. 7 is a block diagram illustrating a configuration for a laser driver according to a second embodiment of the present invention.

FIG. 7 illustrates a configuration for a laser driver according to a second embodiment of the present invention. In FIG. 7, the same components as the counterparts in FIG. 1 are identified by the same reference numerals and the detailed description thereof will be omitted herein.

To speed up the APC operation of the laser driver shown in FIG. 1, the transconductance Gm of the transconductor 4 should be increased. If the transconductance Gm is increased too much, however, then the feedback system loses its stability and ringing might be produced in the APC response of the optical output power.

Thus, according to the second embodiment, an adaptive bias circuit 8 is further provided as shown in FIG. 7 to speed up the APC response by rapidly charging or discharging the holding capacitor 5 if a difference between the monitor voltage Vivc output from the current-to-voltage converter 2 and the reference voltage Vref generated by the reference voltage generator 3 is larger than a predetermined value. In the second embodiment, only the charging operation is supposed to be accelerated for the illustrative purposes only.

Figure 8A:
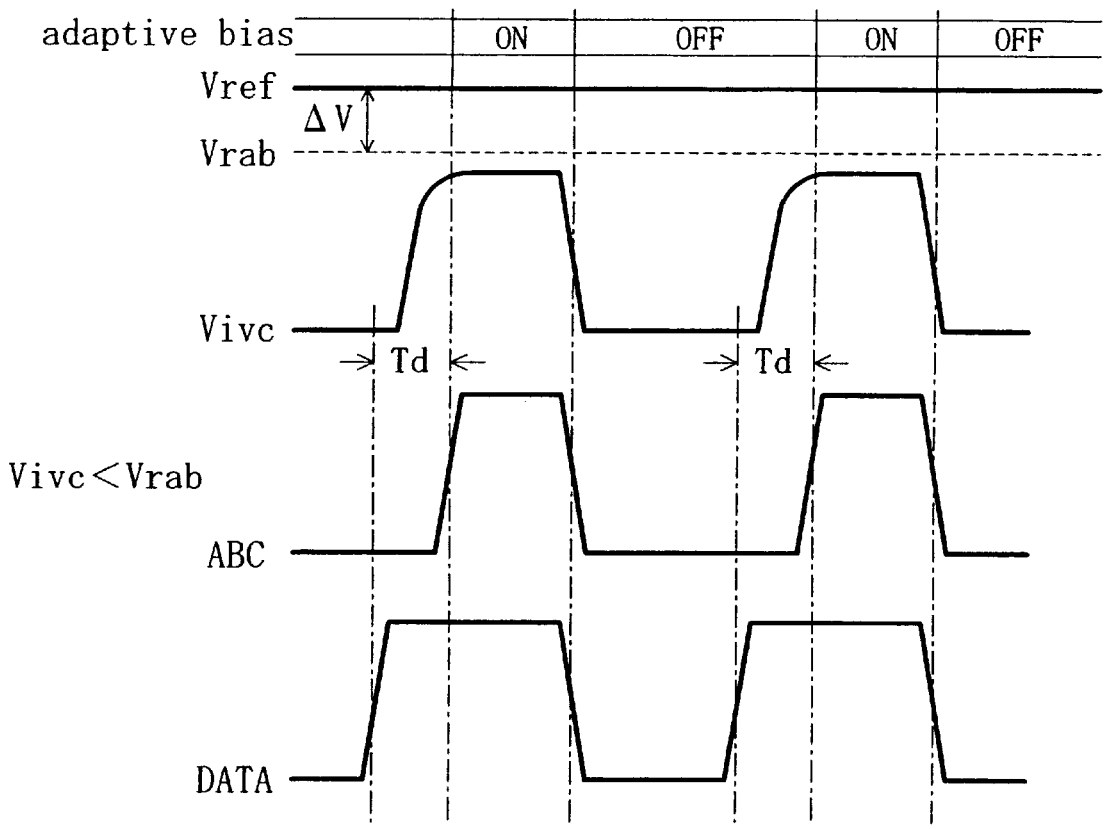
FIGS. 8(a) and 8(b) illustrate how the adaptive bias circuit 8 operates in the laser driver shown in FIG. 7.
Figure 8B:
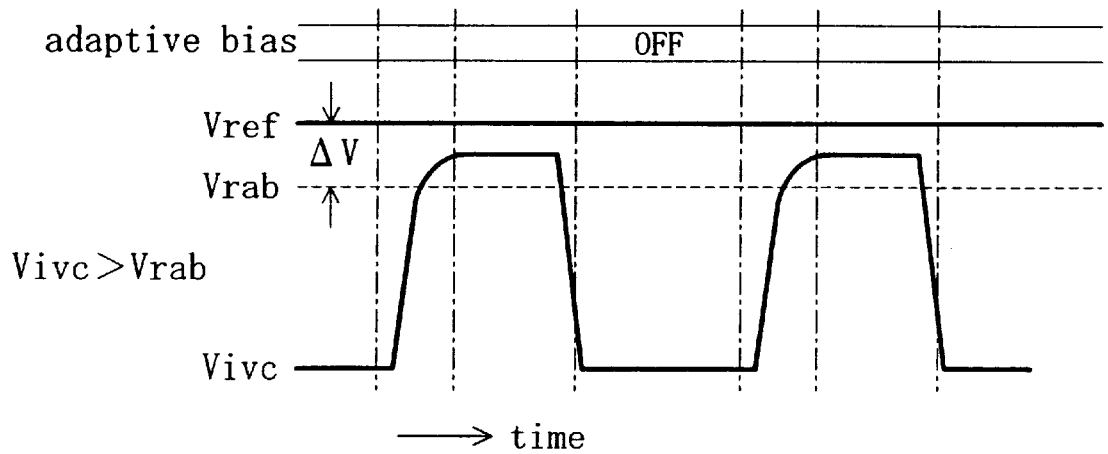

FIGS. 8(a) and 8(b) illustrate how the adaptive bias circuit 8 operates. As shown in FIGS. 8(a) and 8(b), the output voltage Vrab of a comparative voltage generator 9 is set lower than the output voltage Vref of the reference voltage generator 3 by a predetermined potential difference ΔV.

As shown in FIG. 8(a), while the monitor voltage Vivc output from the current-to-voltage converter 2 is lower than the comparative voltage Vrab (=Vref−ΔV), i.e., while the difference between the monitor voltage Vivc and the reference voltage Vref is larger than ΔV, the adaptive bias circuit 8 is operating in such a manner as to rapidly charge the holding capacitor 5 by supplying a large current thereto. As a result, the APC response time can be considerably shortened.

On the other hand, while the monitor voltage Vivc output from the current-to-voltage converter 2 is higher than the comparative voltage Vrab, i.e., while the difference between the monitor voltage Vivc and the reference voltage Vref is smaller than ΔV, the adaptive bias circuit 8 is deactivated as shown in FIG. 8(b). Accordingly, the feedback system does not lose its stability.

Also, as shown in FIG. 8(a), the adaptive bias circuit 8 is activated responsive to a control signal ABC supplied from the control signal generator 7A after the prescribed time Td has passed since the drive current output circuit 6 was made to start to output the laser drive current ILD. Accordingly, the error, which results from the time delay between the laser light emission from the laser diode LD responsive to the drive current ILD and the output of the monitor voltage Vivc by the current-to-voltage converter 2, can also be avoided as in the first embodiment.

Figure 9:
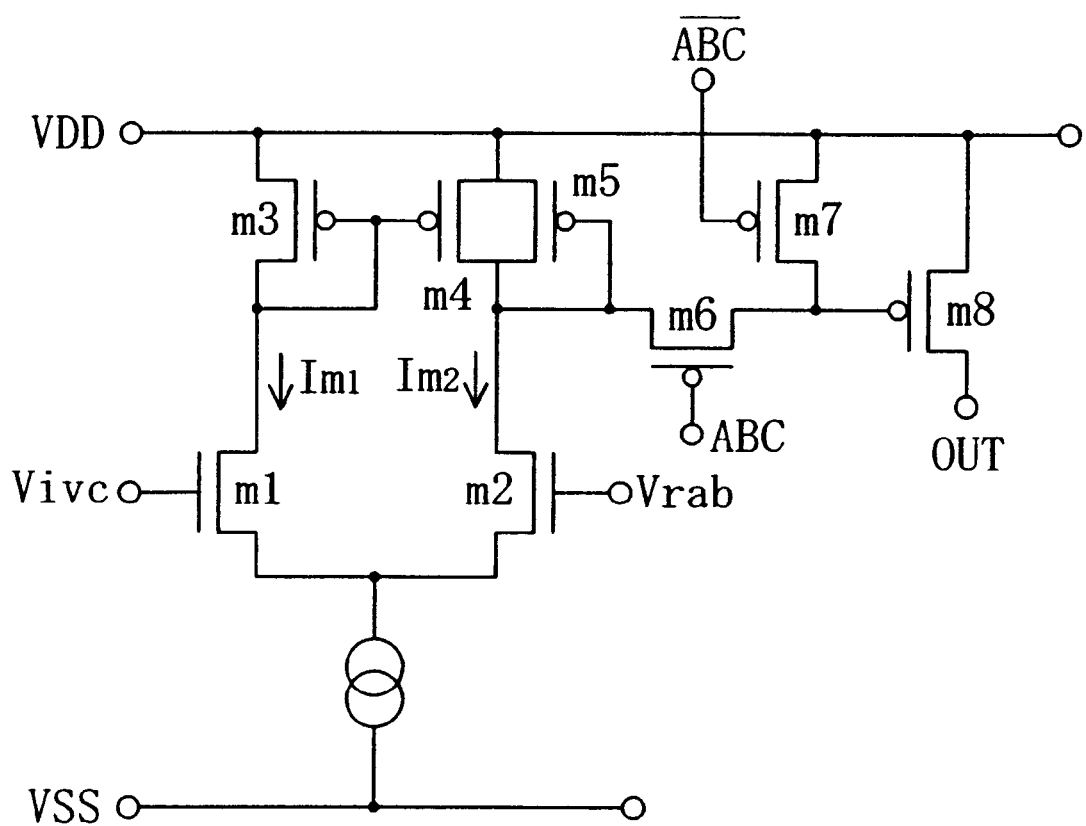
FIG. 9 illustrates an exemplary internal configuration for the adaptive bias circuit 8 of the laser driver shown in FIG. 7.

FIG. 9 illustrates an exemplary internal configuration for the adaptive bias circuit 8. In the circuit shown in FIG. 9, a current Iout represented by $$Iout = 0 \quad \text{(while } Vivc > Vrab\text{)}$$
$$= A(Im2 - Im1) \quad \text{(while } Vivc < Vrab\text{)}$$

(where A is a mirror ratio of a current mirror circuit including the transistors m5 and m8) is output through the output terminal OUT. While Vivc=Vrab, the larger the difference between the monitor voltage Vivc and the comparative voltage Vrab, the larger the output current Iout. In other words, the smaller the difference, the smaller the output current Iout. On the other hand, while Vivc>Vrab, the transistors m5 and m8 are cut off and the output current Iout becomes zero. Also, the ON/OFF states of this circuit are controlled responsive to the control signal ABC, /ABC supplied to the gate of the transistor m6, m7.

EMBODIMENT 3

Figure 10:
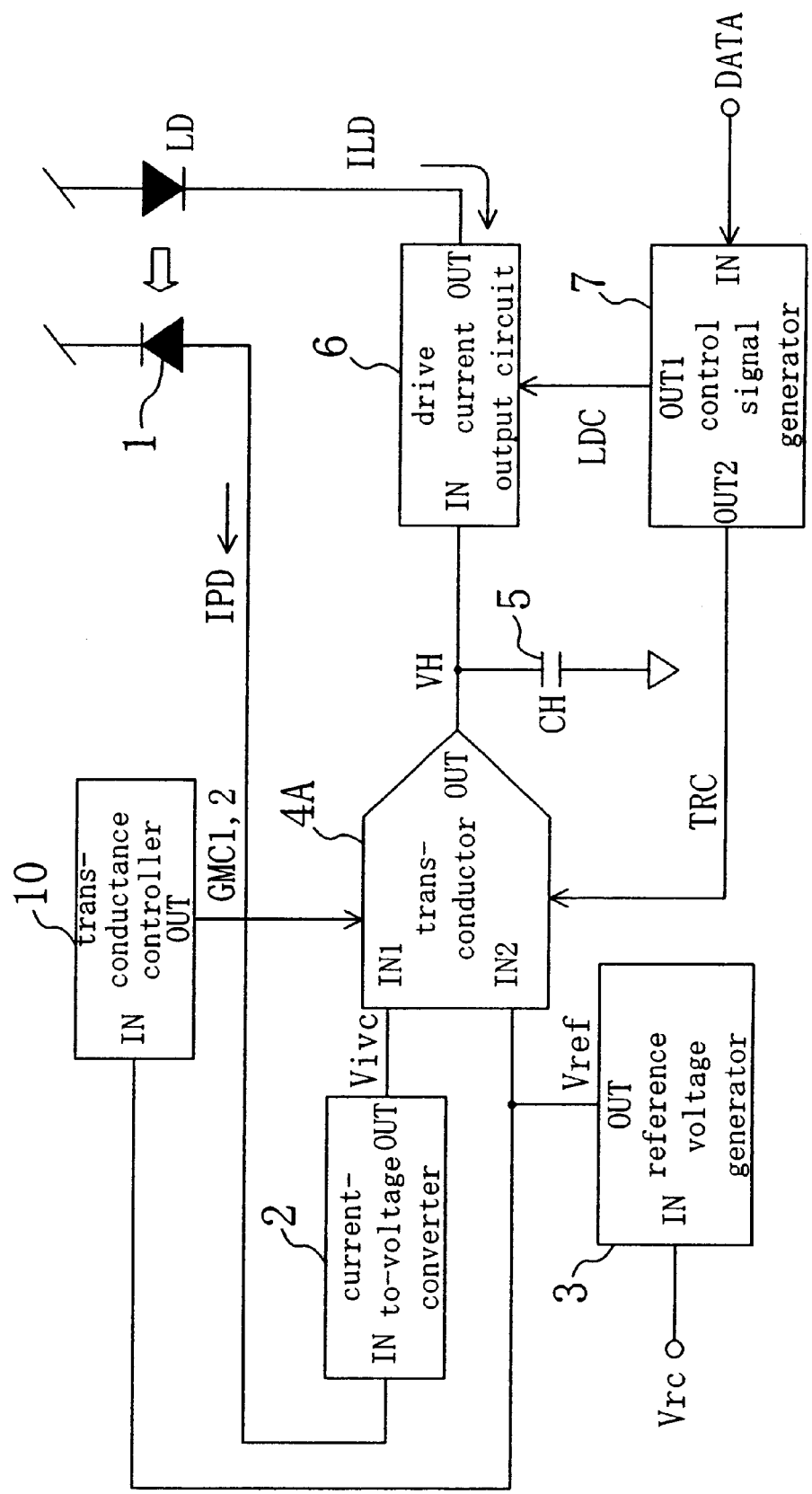
FIG. 10 is a block diagram illustrating a configuration for a laser driver according to a third embodiment of the present invention.

FIG. 10 illustrates a configuration for a laser driver according to a third embodiment of the present invention. In FIG. 10, the same components as the counterparts in FIG. 1 are identified by the same reference numerals and the detailed description thereof will be omitted herein. The laser driver shown in FIG. 10 further includes a transconductance controller 10 for controlling the transconductor Gm of a transconductor 4A based on the reference voltage Vref output from the reference voltage generator 3.

Hereinafter, the response characteristic of the laser driver according to the present invention will be briefly analyzed. The voltage-to-current conversion characteristic of the drive current output circuit 6 is linear. The laser drive current ILD output from the drive current output circuit 6 is given by the following Equation (2):

$$ILD = K \cdot VH \quad (2)$$

where K is the conversion coefficient. The monitor voltage Vivc output from the current-to-voltage converter 2 is given by the following Equation (3):

$$Vivc = \kappa \gamma \beta \alpha K \cdot VH \quad (3)$$

where α is the current-to-optical-output conversion efficiency of the laser diode LD, β is a coefficient of coupling between the laser diode LD and the monitoring photodiode 1, γ is the optical-input-to-current conversion efficiency of the monitoring photodiode 1 and κ is the conversion gain of the current-to-voltage converter 2.

The potential difference between the monitor voltage Vivc and the output voltage Vref of the reference voltage generator 3 is converted by the transconductor 4 into a current corresponding to the potential difference. Then, the current is supplied into the holding capacitor 5. The output current Iout of the transconductor 4 is given by the following Equation (4):

$$Iout = Gm(Vref - Vivc) \quad (4)$$
$$= Gm(Vref - \kappa\gamma\beta\alpha K \cdot VH)$$

thus, $$dVH = Iout \cdot dt / CH \quad (5)$$
$$= Gm(Vref - \kappa\gamma\beta\alpha K \cdot VH)dt / CH$$

By solving this differential equation (5), the response of the voltage VH held by the holding capacitor 5 is represented by the following Equations (6), (7) and (8):

$$VH = V0(1 - exp(-t/\tau)) \quad (6)$$

where $$V0 = Vref/(\kappa\gamma\beta\alpha K) \quad (7)$$
$$\tau = CH/(\kappa\gamma\beta\alpha K Gm) \quad (8)$$

As is clear from the Equation (8), the time constant τ of the APC is inversely proportional to the coefficient β of coupling between the laser diode LD and the monitoring photodiode 1. In general, the coefficient β of coupling between the laser diode LD and the monitoring photodiode 1 is greatly changeable by the factor of 5 to 10 because of assembling-induced variation. Accordingly, the APC response time is also greatly changeable with the variation of the coupling coefficient β.

As is also clear from the Equation (8), if the transconductance Gm is controlled to be inversely proportional to the coupling coefficient β, then the time constant τ can be kept constant. On the other hand, as can be seen from Equations (2), (6) and (7), the reference voltage Vref to be defined for obtaining required optical output power is a function of the coupling coefficient β.

Thus, according to this embodiment, the transconductance controller 10 controls the transconductance Gm of the transconductor 4A based on the reference voltage Vref by supplying control signals GMC1 and GMC2 thereto.

Figure 11:
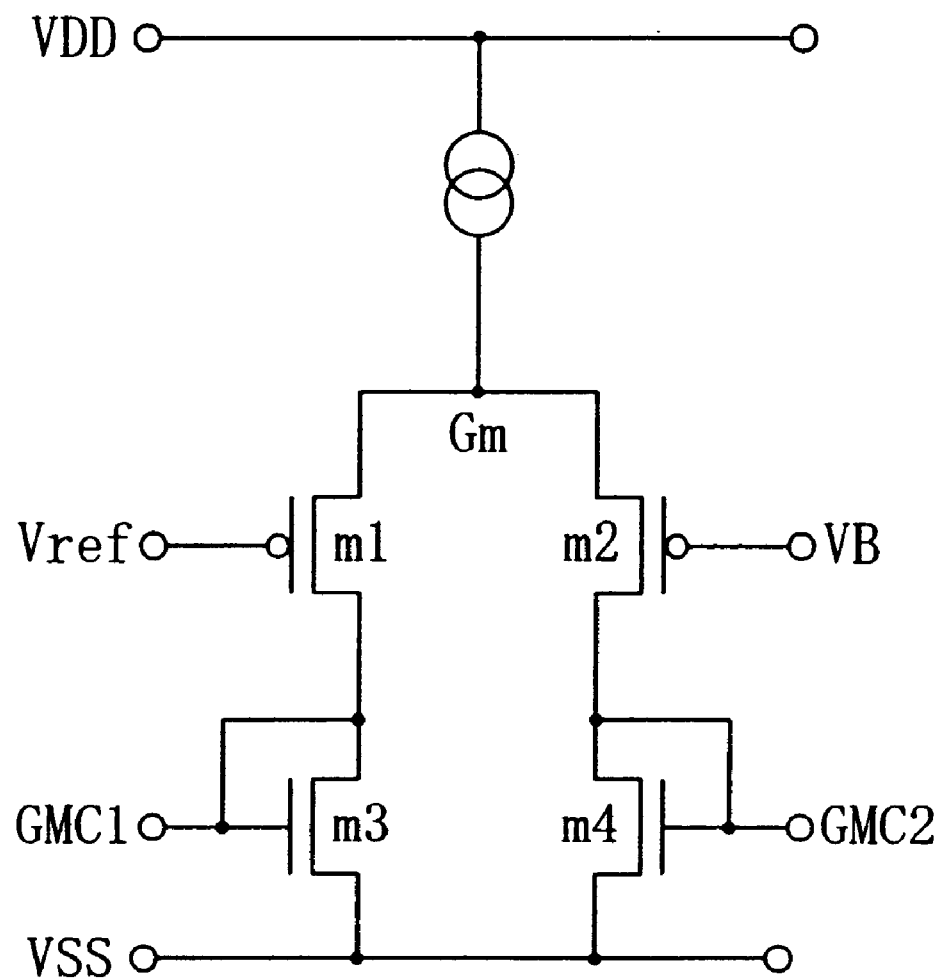
FIG. 11 illustrates an exemplary internal configuration for the transconductance controller 10 of the laser driver shown in FIG. 10.
Figure 12:
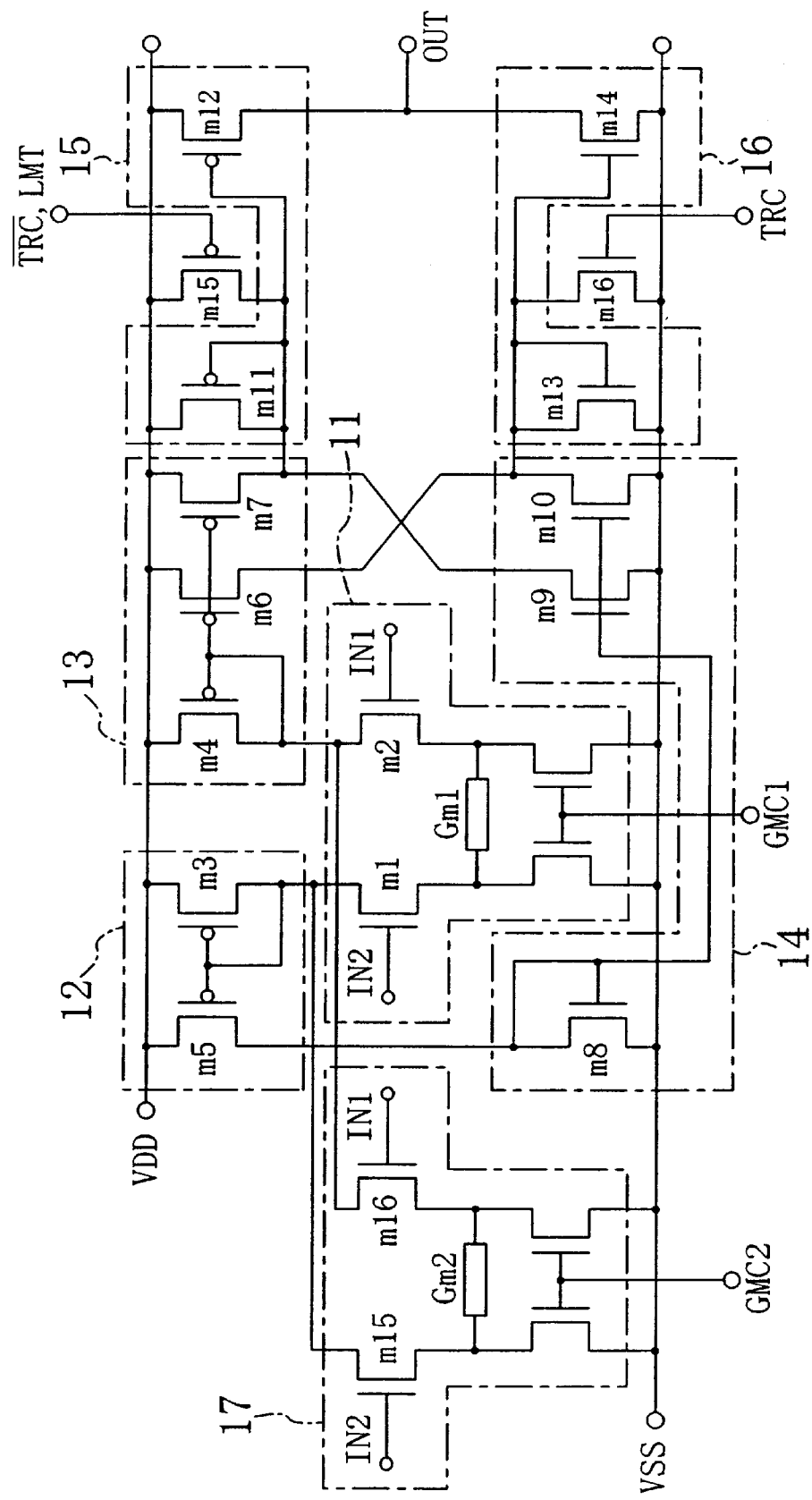
FIG. 12 illustrates an exemplary internal configuration for the transconductor 4A of the laser driver shown in FIG. 10.

FIG. 11 illustrates an exemplary internal configuration for the transconductance controller 10, while FIG. 12 illustrates an exemplary internal configuration for the transconductor 4A.

To keep the time constant τ unchanged, the transconductance Gm may be set inversely proportional to the coupling coefficient β by controlling the bias current of the transconductor 4 based on the reference voltage Vref, for example. According to this technique, however, it is difficult to control the transconductance Gm over a wide range and with high precision.

Thus, according to this embodiment, a pair of differential input stages 11 and 17 with mutually different transconductances Gm1 and Gm2 are provided for the transconductor 4A as shown in FIG. 12. And the bias current ratio between these two differential input stages 11 and 17 is changed responsive to the control signals GMC1 and GMC2 supplied from the transconductance controller 10. Then, the transconductance Gm of the transconductor 4A is easily controllable within the range from more than Gm1 to less than Gm2.

The transconductance controller 10 shown in FIG. 11 determines bias voltages GMC1 and GMC2 based on the currents flowing through a differential pair of transistors m1 and m2 by making the transistors m1 and m2 compare the reference voltage Vref to a predetermined voltage VB. That is to say, by setting the voltage VB and the transconductance of the differential pair of transistors m1 and m2 at appropriate values, the transconductance Gm of the transconductor 4A can be controlled at such a value as keeping the time constant τ of the APC unchanged.

EMBODIMENT 4

Figure 13:
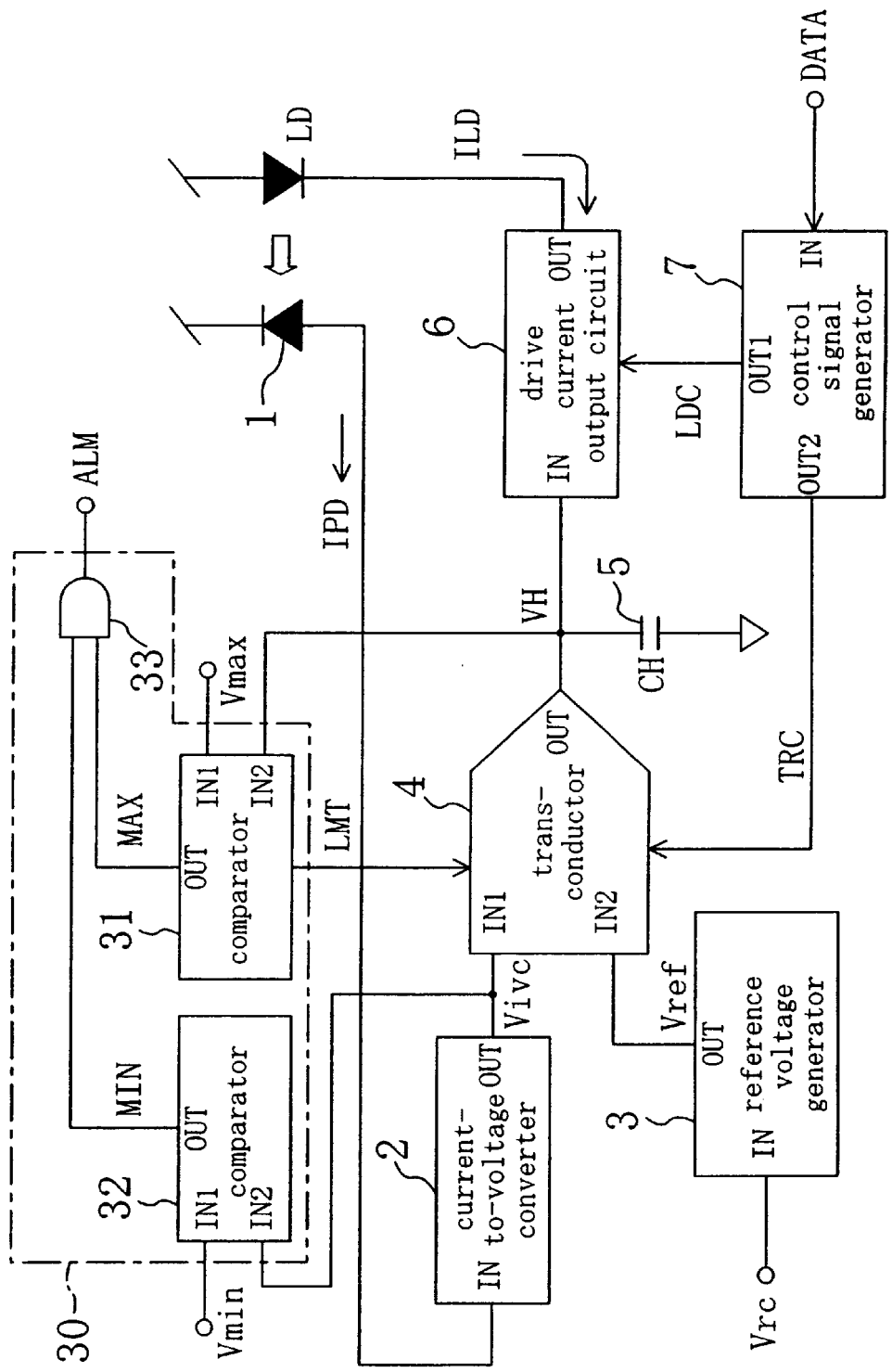
FIG. 13 is a block diagram illustrating a configuration for a laser driver according to a fourth embodiment of the present invention.

FIG. 13 illustrates a configuration for a laser driver according to a fourth embodiment of the present invention. In FIG. 13, the same components as the counterparts in FIG. 1 are identified by the same reference numerals and the detailed description thereof will be omitted herein.

The drive current output circuit 6 outputs a current corresponding to the voltage VH held by the holding capacitor 5 as the laser drive current ILD. That is to say, there is a correspondence between the laser drive current ILD and the voltage VH. Thus, the laser driver according to the fourth embodiment includes a first comparator 31 for comparing the voltage VH held by the holding capacitor 5 to a maximum voltage Vmax corresponding to the upper limit of the laser drive current ILD. Once the voltage VH held by the holding capacitor 5 has exceeded the maximum voltage Vmax, the first comparator 31 supplies a control signal LMT to deactivate the transconductor 4 such that the laser drive current ILD is not increased anymore by the further rise of the voltage VH. The signal LMT is supplied to the gate of the transistor m15 in the transconductor 4 or 4A shown in FIG. 4 or 12.

In the laser driver according to the fourth embodiment, no laser drive current ILD exceeding the upper limit is output from the drive current output circuit 6. Accordingly, it is possible to prevent the laser diode LD from being broken down due to an excessive current. If the adaptive bias circuit 8 is additionally provided as in the second embodiment, the adaptive bias circuit 8 should also be controlled using the control signal LMT.

The laser driver according to the fourth embodiment further includes a second comparator 32 for comparing the monitor voltage Vivc, which is output from the current-to-voltage converter 2, to a predetermined minimum voltage Vmin. The minimum voltage Vmin is set equal to a monitor voltage Vivc for the lowest optical output power required for the laser diode LD. An AND gate 33 is further provided to obtain a logical product of the comparison results supplied from the first and second comparators 31 and 32, and to output the logical product as an alarm signal ALM. The first and second comparators 31 and 32 and the AND gate 33 together constitute an alarm circuit 30.

Suppose the voltage VH held by the holding capacitor 5 is higher than the maximum voltage Vmax and the monitor voltage Vivc is lower than the minimum voltage Vmin, i.e., the optical output power of the laser diode LD is less than the minimum required value. Then, the alarm circuit 30 shown in FIG. 13 outputs the alarm signal ALM. Accordingly, if the laser diode LD is not outputting the minimum required optical power although the APC is working properly, then the alarm signal ALM is output. In this manner, a fault of the laser diode LD, if any, can be spotted easily.

Figure 14:
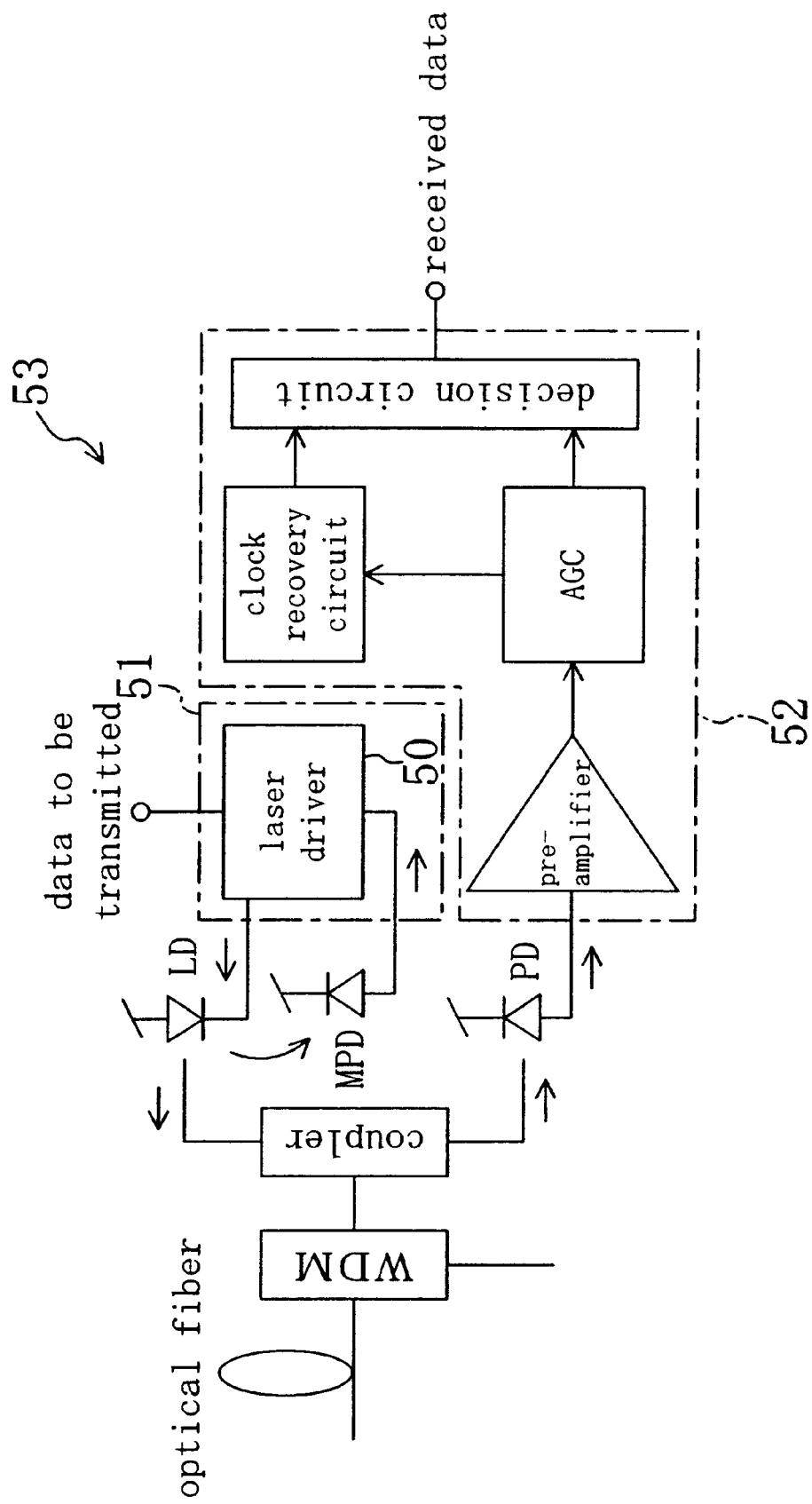
FIG. 14 is a block diagram illustrating an exemplary configuration for an optical transceiver according to the present invention.

FIG. 14 illustrates an exemplary configuration for an optical transceiver according to the present invention. The optical transceiver 53 shown in FIG. 14 includes: a transmitter section 51 for converting data to be transmitted into laser light by driving the laser diode LD and then transmitting the laser light; and a receiver section 52 for converting the laser light received into received data. The transmitter section 51 includes the laser driver 50 according to the present invention and transmits the data by driving the laser diode LD using the laser driver 50.

What is claimed is:

1. A laser driver for driving a laser diode, comprising:
   a current-to-voltage converter for converting an output current of a photodiode into a voltage and then outputting the voltage as a monitor voltage, the photodiode monitoring optical output power of the laser diode;
   a reference voltage generator for generating a predetermined reference voltage;
   a transconductor, which receives the monitor and reference voltages and supplies an output current corresponding to a difference between the monitor and reference voltages;
   a holding capacitor connected to an output terminal of the transconductor; such that the transconductor supplies the output current to the holding capacitor;
   a drive current output circuit, which receives a voltage held by the holding capacitor as an input voltage and outputs a laser drive current corresponding to the input voltage, said holding capacitor continuously outputting said voltage to said drive current output circuit,
   wherein the laser driver is constructed to perform a feedback control as to equalize the monitor voltage with the predetermined reference voltage.

2. The laser driver of claim 1, wherein the current-to-voltage converter comprises:
   an inverting amplifier receiving the output current of the photodiode; and
   a feedback resistor connected between input and output terminals of the inverting amplifier.

3. The laser driver of claim 1, wherein the current-to-voltage converter comprises:
   a transistor, the source and drain of the transistor being connected to the input and output of the current-to-voltage converter, respectively, a constant voltage being applied to the gate of the transistor;
   a constant-current power supply connected to the source of the transistor; and
   a resistor connected to the drain of the transistor.

4. The laser driver of claim 1, wherein the predetermined reference voltage generated by the reference voltage generator is controllable responsive to an external input.

5. The laser driver of claim 1, wherein the transconductor comprises:
   a differential input stage for receiving the two input voltages;
   a first current mirror circuit, the input of the first current mirror circuit being connected to one of two outputs of the differential input stage;
   a second current mirror circuit with two outputs, the input of the second current mirror circuit being connected to the other output of the differential input stage;
   a third current mirror circuit with two outputs, the input of the third current mirror circuit being connected to the output of the first current mirror circuit, the two outputs of the third current mirror circuit being connected to the two outputs of the second current mirror circuit, respectively;
   a fourth current mirror circuit including transistors of one conductivity type, the input of the fourth current mirror circuit being connected to one of the two outputs of the third current mirror circuit; and
   a fifth current mirror circuit including transistors of the other conductivity type, the input of the fifth current mirror circuit being connected to the other output of the third current mirror circuit,
   wherein the outputs of the fourth and fifth current mirror circuits are connected to each other at a node, from which the current is output.

6. The laser driver of claim 1, further comprising a control signal generator for controlling the operations of the drive current output circuit and the transconductor responsive to a data signal,
   wherein the control signal generator activates the transconductor after a prescribed time has passed since the drive current output circuit was made to start to output the laser drive current by the control signal generator.

7. The laser driver of claim 1, further comprising an adaptive bias circuit for charging or discharging the holding capacitor in such a manner as to reduce a difference between the monitor and reference voltages if the difference is larger than a predetermined value.

8. The laser driver of claim 7, further comprising a control signal generator for controlling the operations of the drive current output circuit and the adaptive bias circuit responsive to a data signal,
   wherein the control signal generator activates the adaptive bias circuit if the difference between the monitor and reference voltages is larger than the predetermined value after a prescribed time has passed since the drive current output circuit was made to start to output the laser drive current by the control signal generator.

9. The laser driver of claim 1, further comprising a transconductance controller for controlling a transconductance of the transconductor based on the predetermined reference voltage.

10. The laser driver of claim 9, wherein the transconductance controller controls the transconductance by changing a bias current of a differential input stage included in the transconductor.

11. The laser driver of claim 9, wherein the transconductor comprises first and second differential input stages with mutually different transconductance, and
   wherein the transconductance controller controls the transconductance by changing a bias current ratio of the first and second differential input stages.

12. The laser driver of claim 1, wherein a voltage held by the holding capacitor is limited such that the laser drive current does not exceed a predetermined upper limit.

13. The laser driver of claim 1, further comprising an alarm circuit for outputting an alarm signal if a voltage held by the holding capacitor exceeds a predetermined upper limit and if the monitor voltage is smaller than a predetermined lower limit.

14. An optical transceiver for establishing an optical communication, comprising:
   a transmitter section for converting data to be transmitted into laser light by driving a laser diode and then transmitting the laser light; and
   a receiver section for converting the laser light received into received data,
   wherein the transmitter section includes the laser driver as recited in claim 1 and drives the laser diode using the laser driver.

* * * * *